United States Patent
Lin et al.

(10) Patent No.: US 6,875,709 B2
(45) Date of Patent: Apr. 5, 2005

(54) APPLICATION OF A SUPERCRITICAL $CO_2$ SYSTEM FOR CURING LOW K DIELECTRIC MATERIALS

(75) Inventors: Chun-Hsien Lin, Hsin Chu (TW); Henry Lo, Hsinchu (TW); Anthony Liu, Hsinchu (TW); Yu-Liang Lin, Hsin-Chu (TW)

(73) Assignee: Taiwan Semiconductor Manufacturing Comapny, Ltd., Hsin-Chu (TW)

( * ) Notice: Subject to any disclaimer, the term of this patent is extended or adjusted under 35 U.S.C. 154(b) by 0 days.

(21) Appl. No.: 10/383,710

(22) Filed: Mar. 7, 2003

(65) Prior Publication Data

US 2004/0175958 A1 Sep. 9, 2004

(51) Int. Cl.[7] .................. H01L 21/31; H01L 21/469
(52) U.S. Cl. .................. 438/781; 438/782; 438/793; 134/10; 134/12
(58) Field of Search .................. 438/781, 782, 438/761, 763, 774, 778, 780, 793, 794, 790, 762; 134/12, 10

(56) References Cited

U.S. PATENT DOCUMENTS

| | | | | |
|---|---|---|---|---|
| 5,868,856 A | * | 2/1999 | Douglas et al. .............. | 134/2 |
| 5,868,862 A | * | 2/1999 | Douglas et al. .............. | 134/26 |
| 6,077,792 A | * | 6/2000 | Farrar .................. | 438/780 |
| 6,156,661 A | | 12/2000 | Small .................. | 438/692 |
| 6,306,754 B1 | | 10/2001 | Agarwal .................. | 438/619 |
| 6,319,819 B1 | | 11/2001 | Besser et al. .............. | 438/633 |
| 6,346,484 B1 | | 2/2002 | Cotte et al. .............. | 438/725 |
| 2001/0050096 A1 | * | 12/2001 | Costantini et al. ........ | 134/58 R |
| 2003/0047195 A1 | * | 3/2003 | DeYoung et al. ............ | 134/12 |
| 2003/0157248 A1 | * | 8/2003 | Watkins et al. ............ | 427/256 |
| 2004/0096672 A1 | * | 5/2004 | Lukas et al. .............. | 428/446 |

FOREIGN PATENT DOCUMENTS

| TW | 338067 | 5/1985 |
|---|---|---|
| TW | 318151 | 7/1985 |
| TW | 500985 | 10/1989 |

* cited by examiner

*Primary Examiner*—Caridad Everhart
(74) *Attorney, Agent, or Firm*—Haynes and Boone, LLP

(57) ABSTRACT

A method and apparatus for curing and modifying a low k dielectric layer in an interconnect structure is disclosed. A spin-on low k dielectric layer which includes an organic silsesquioxane, polyarylether, bisbenzocyclobuene, or SiLK is spin coated on a substrate. The substrate is placed in a process chamber in a supercritical $CO_2$ system and is treated at a temperature between 30° C. and 150° C. and at a pressure from 70 to 700 atmospheres. A co-solvent such as $CF_3$—X or F—X is added that selectively replaces C—$CH_3$ bonds with C—$CF_3$ or C—F bonds. Alternatively, $H_2O_2$ is employed as co-solvent to replace a halogen in a C—Z bond where Z=F, Cl, or Br with an hydroxyl group. Two co-solvents may be combined with $CO_2$ for more flexibility. The cured dielectric layer has improved properties that include better adhesion, lower k value, increased hardness, and a higher elastic modulus.

78 Claims, 3 Drawing Sheets

APPLICATION OF A SUPERCRITICAL CO₂ SYSTEM FOR CURING LOW K DIELECTRIC MATERIALS

FIELD OF THE INVENTION

The invention relates to the field of fabricating integrated circuits and other electronic devices and in particular to a more efficient way of curing a low k dielectric layer on a substrate that can also modify the film properties.

BACKGROUND OF THE INVENTION

The manufacture of integrated circuits in a semiconductor device involves the formation of a sequence of layers that are linked by metal wiring. Metal interconnects are typically constructed by patterning trenches and vias in a photosensitive layer and then etching the pattern into one or more dielectric layers. A damascene process is generally employed to fill the etched openings and planarize the deposited metal. As the dimension of the wiring and the intermetal dielectric layer distances have steadily decreased in order to satisfy a constant demand for higher performance in electronic devices, the challenge to prevent crosstalk between the wiring has been a key focus for semiconductor manufacturers. One important improvement in preventing capacitance coupling between metal layers has been the introduction of low k dielectric materials. A commonly used $SiO_2$ dielectric layer having a dielectric constant (k) of about 4 is being replaced by other materials with a k value of between 2 and 3.

Dielectric layers are often deposited by a chemical vapor deposition (CVD) method or by a plasma enhanced CVD (PECVD) process. Low k dielectric materials that are deposited in this manner include carbon doped $SiO_2$, fluorine doped $SiO_2$, fluorosilicate glass (FSG), borophosphosilicate glass (BPSG), and "Black Diamond" from Applied Materials. Other low k materials such as polyimides, silsesquioxanes, polyarylethers, and SiLK from Novellus are available in solution and can be coated on a substrate by a spin-on technique. With a spin-on layer, the coated film is normally cured by baking the substrate in an oven. This method is costly in terms of a low throughput since a considerable amount of time is required to carefully ramp up the furnace to an elevated temperature once the substrates are loaded in the chamber. Furthermore, this curing method is expensive because a great deal of energy is expended to maintain a large enclosed area at a high temperature. The batch process in which a boat of substrates is treated in a furnace is no longer compatible with a single wafer mode necessary for high throughput when handling 300 mm size substrates.

Another increasingly important concern associated with shrinking device dimensions is the cleanliness of the fabrication process. Air handling systems are becoming more complex in order to remove particles from the air that can cause a defect in a device. Trace amounts of metals and organic solvents must be removed from a substrate by cleaning steps to prevent contamination that leads to a loss in device performance. Residues from etching steps and from photoresist removal methods are also a cause for concern. To avoid a costly rework process that involves repeating several steps in a sequence, a cleaning step is usually inserted at points in manufacturing scheme where a defect free surface is mandatory before the next process is started.

A process is described in U.S. Pat. No. 6,156,661 for removing trace amounts of amines following an amine based treatment such as a photoresist strip. The treatment involves an aqueous solution containing an organic acid that is maintained within a pH range of about 4 to 6 by a buffering agent like hydroxylamine. The solution can also contain an oxidizer to repair metal surfaces that are damaged by an etch or by a polishing step. Additionally, the method can reduce the level of mobile ions and unwanted transition metal ions that are absorbed on a substrate.

Another method for treating a substrate in preparation for a subsequent process step is mentioned in U.S. Pat. No. 6,319,819. This method relates to removing oxides from copper surfaces to prevent electromigration, improve adhesion, and decrease contact resistance. A metal such as Mg, Cr, Ti, Ta, or Ni is deposited by a physical vapor technique and diffuses into the upper regions of a copper layer where it reduces copper oxide. After a polishing step, a passivation layer remains on the copper to prevent further oxide formation.

Yet another method of removing organic materials from a substrate is by subjecting the substrate to a supercritical fluid (SCF) such as $CO_2$ or ethylene. U.S. Pat. No. 6,346,484 provides details for removing a sacrificial place holder (SPH) material such as a polysilsesquioxane through a porous bridge layer. The extraction occurs at a high pressure of about 100 atmospheres and at an elevated temperature. The solute and SCF are transported to a separator which is at a lower temperature to precipitate the solute. Then the SCF is repressurized and recycled back to the extraction chamber. The bridge layer is then sealed to form an air gap with a dielectric constant of 1 between metal interconnects.

In U.S. Pat. No. 6,306,754, a SCF is used to remove a temporary structural solid through a dielectric layer such as porous $SiO_2$. Residual alcohol solvent within the $SiO_2$ is also removed to effect a cure process. An average pore size of from 2 to 50 nm is specified and pores preferably represent between 5 and 30% of the total volume of the $SiO_2$ layer that is spin coated from a solution of tetraethylorthosilicate (TEOS) in ethanol and water. The SCF process may include a co-solvent such as a ketone or alcohol and takes place in a chamber heated between 30° C. and 100° C. The upper temperature is limited since the temporary structural solid is a photoresist that is sensitive to temperatures above 100° C. where it could decompose and be more difficult to extract.

Although the prior art teaches the application of SCF to remove solvent from a dielectric layer, the method is restricted to $SiO_2$ with a maximum pore volume of 30% and operating conditions below 100° C. There is a need to expand the range of applicability to other low k spin-on materials such as organic dielectric layers that have pore sizes as small as 1 nm, pore volumes above 30%, and where extraction temperatures of up to 150° C. are preferred. Furthermore, it is desirable to employ a co-solvent that can lower the dielectric constant and strengthen the hardness and elastic modulus of the treated layer as it is being cured.

SUMMARY OF THE INVENTION

An objective of the present invention is to provide a method of curing a spin-on low k dielectric material in a high throughput, low cost manner.

A further objective of the present invention is to provide a method of removing undesired components from a spin-on coating that prevents cross-contamination.

A still further objective of the present invention is to provide a method of curing a spin-on low k dielectric material that is compatible with a single wafer process.

Yet another objective is to provide a method of curing a low k dielectric material that also selectively replaces certain groups to further reduce the dielectric constant of said dielectric material or to improve adhesion to a layer that is formed on the cured dielectric layer. It is also desirable for said method to strengthen the hardness and elastic modulus of the dielectric material.

These objectives are achieved by coating a low k dielectric material on a substrate that can be as large as a 300 mm wafer. The coated substrate is placed in a process chamber that is designed for a single wafer mode. The process chamber is part of a supercritical $CO_2$ system that includes a $CO_2$ working tank and a pump to introduce $CO_2$ into a continuous loop. A co-solvent such as $CF_3$—X, Y—F, or $H_2O_2$ where X=$NR_1R_2$, —$OR_3$, —$O_2CR_3$, —(C=O)$R_3$, or $R_3$ and Y=H or an alkyl group and $R_1$, $R_2$, R=H or an alkyl group is introduced through metering pumps to mix with $CO_2$ prior to being fed into the process chamber with the coated substrate. Preferably, the mixture is preheated so that a supercritical fluid (SCF) is formed before reaching the substrate. The working range for achieving a SCF comprised of $CO_2$ and co-solvent is a pressure between 1000 and 10000 psi and a temperature from about 30° C. to about 150° C. The flow rate of the SCF through the chamber is about 1 to 15 liters per minute. The substrate is subjected to the SCF treatment for a period of from 60 to 360 seconds to remove all undesirable components from the coated low k film including residual solvent and low molecular weight organic compounds.

When the low k dielectric layer contains C—$CH_3$ groups, the co-solvent reacts with the low dielectric material to replace some of the methyl groups with $CF_3$ groups to form C—$CF_3$ bonds. Alternatively, when a Y—F co-solvent is used in the SCF, some methyl groups in the C—$CH_3$ bonds are replaced F to generate C—F bonds in the low k dielectric layer. If the low k dielectric layer is a material that contains C-Z groups where Z=Cl, Br, or F, then treatment with a SCF comprised of $CO_2$ and $H_2O_2$ can replace a halogen with an hydroxyl group to form a C—OH bond.

In a second embodiment, two co-solvents are introduced to form a SCF with $CO_2$. For example, a three component SCF is produced with a $CO_2$ flow rate of 1000 to 15000 sccm, a $CF_3$—X flow rate of 10 to 100 sccm, and a Y—F flow rate of 10 to 1000 sccm. The ratio of $CF_3$—X to Y—F is altered to control the relative amount of C—$CF_3$ and C—F bond formation and thereby vary the properties of the cured dielectric film such as dielectric constant, elastic modulus, and adhesion to other layers that are subsequently coated on the cured layer. Alternatively, a mixture of $CO_2$, Y—F, and $H_2O_2$ can be employed to form C—F bonds in addition to C—OH bonds in the cured dielectric material.

The invention also provides an apparatus suitable for carrying out the two SCF method embodiments. The apparatus is comprised of a continuous loop system that can withstand pressures from about 70 to 700 atmospheres and temperatures of about 30° C. to 150° C. and includes a process chamber that is capable of holding a 300 mm wafer in place during a supercritical fluid (SCF) treatment, a port for an end point detection system, a separator for removing co-solvents, solids, monomers, $O_2$, and $N_2$ from the SCF, a hydrocarbon knock out chamber, a chiller, a working $CO_2$ tank, a preheater, and a $CO_2$ pump. The apparatus is further comprised of a make up tank for $CO_2$, a source tank for a first co-solvent and a second source tank for a second co-solvent, pumps for introducing co-solvents into the continuous loop system and tubing and valves for directing, regulating, and containing the SCF flow within the continuous loop. The supercritical fluid employed in the apparatus is comprised of $CO_2$ and one or more co-solvents that were described in the first two embodiments.

The arrangement of components within the continuous loop SCF system enables an efficient process for curing and modifying a low k dielectric layer on a single substrate in the process chamber. A working tank in the continuous loop provides $CO_2$ that is pumped towards the process chamber by a $CO_2$ pump. Co-solvents are pumped from source tanks through valves and are mixed with the $CO_2$ before the SCF reaches a preheater which is just upstream from the process chamber and regulates the temperature of the SCF. A substrate within the chamber is treated with a continuous SCF flow. The SCF effluent from the chamber is monitored from a port in the continuous loop just downstream from the process chamber. The port is connected to an end point detector so that a real time determination can be made when the dielectric layer is completely cured. The effluent is then cooled at a lower pressure in a separator to precipitate any compounds that were removed from the dielectric material and to remove co-solvents, $O_2$, and $N_2$. A chiller is placed downstream from the separator to control the flow of $CO_2$ in the SCF. Recycled $CO_2$ is fed from the chiller into the working tank where it is mixed with fresh $CO_2$ from the make up tank to complete the cycle in the continuous loop. Valves are closed to isolate the process chamber and to allow a pressure release so that a treated substrate can be removed and replaced by an untreated substrate for the next cycle.

DETAILED DESCRIPTION OF THE INVENTION

The present invention is a particularly useful method of curing a spin-on low k dielectric layer and altering its properties and composition for improved performance as an interlevel dielectric layer or an intrametal dielectric layer in an interconnect structure.

Figure 1:
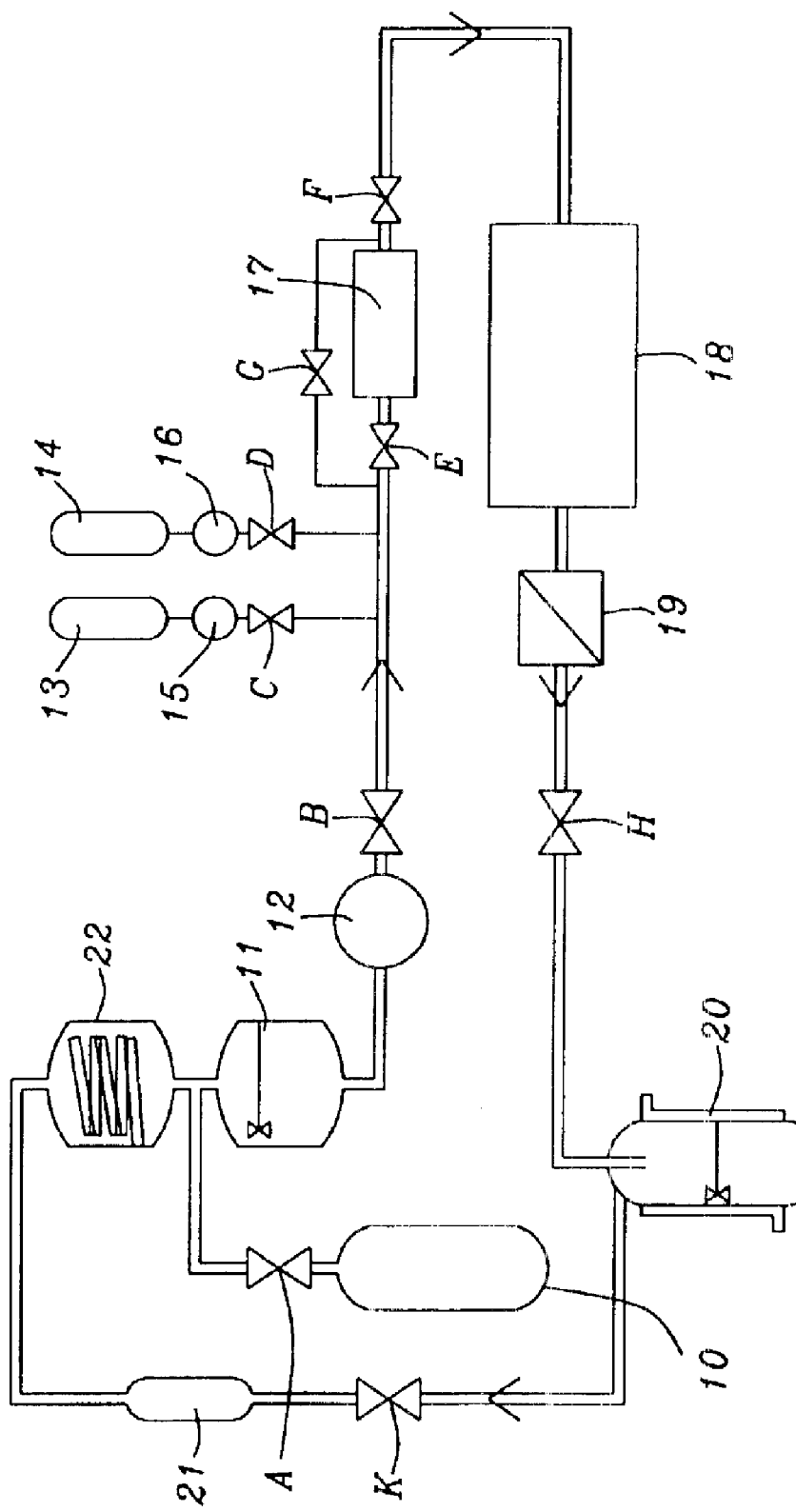
FIG. 1 is a drawing that depicts a continuous loop SCF system.

Referring to FIG. 1, a continuous loop system is shown in which supercritical $CO_2$ and co-solvent are introduced to cure a spin-on dielectric layer on a substrate in a process chamber. It should be understood that the tubing, valves, pumps, and chambers within the system are comprised of one or more materials that are capable of withstanding high pressures and elevated temperatures necessary to reliably perform the desired extraction without leaks or unscheduled downtime. Moreover, the valves, pumps, and tubing are able to regulate, direct, and contain the flow of supercritical fluid (SCF) within the continuous loop.

The cycle begins at valve A which regulates the flow of $CO_2$ from a make-up tank 10 into a $CO_2$ working tank 11 that is located within the continuous loop system. A $CO_2$ pump 12 directs the flow of $CO_2$ through valve B toward a preheater 17. Tank 13 contains a first co-solvent that can be fed into the continuous loop system by pump 15 through valve C to mix with $CO_2$. Likewise, a second co-solvent in tank 14 can be fed into the continuous loop system by pump 16 through valve D. Valve E allows the mixture of $CO_2$ and co-solvent to enter the preheater 17 to reach a temperature in the range of about 30° C. to 150° C. Alternatively, valve E can be closed and valve G opened to divert the flow of the mixture around the preheater 17. Valve F is opened to permit the supercritical fluid (SCF) to reach the process chamber 18 where a substrate (not shown) is placed for treatment.

Process chamber 18 contains valves (not shown) that can be closed to temporarily halt the flow of SCF through the chamber 18 so that pressure can be released from the chamber and a treated substrate can be replaced with an untreated substrate. Preferably, the process chamber 18 is cooled to room temperature and is depressurized to about 1 atmosphere before the chamber is opened. The process chamber 18 preferably has an open mode with an opening large enough to allow a 300 mm diameter wafer to be moved in or out of the chamber and has a chuck or stage (not shown) that is able to hold a 300 mm wafer in position during a SCF treatment. A normal range of pressure inside chamber 18 during SCF treatment of the substrate is between 1000 and 10000 psi (70–700 atmospheres).

A port that is connected to an end point detect system 19 is located in the continuous loop immediately downstream from the process chamber 18. The end point detect system 19 includes a measurement tool such as a spectrometer that performs an analysis of a sample of effluent and records the amount of residual solvent and other extracted materials that are present in the effluent from the process chamber 18. When the amount of extracted materials in the sample is determined to be below a detectable level, then the flow of SCF is stopped temporarily while a finished substrate is replaced with an untreated substrate.

Valve H controls the flow of SCF effluent to a separator 20 which is at a lower temperature and pressure than process chamber 18. Typical conditions in separator 20 are a temperature of about 0° C. to 32° C. and a pressure between about 15 and 2000 psi. These conditions enable solvent and solid extracted from the dielectric material layer on the substrate in chamber 18 to be collected in separator 20 and removed through valve J. Additionally, $O_2$ and $N_2$ from air trapped within the chamber during the loading process and SCF co-solvents that were introduced into the continuous loop from tanks 13, 14 are collected in separator 20 and are removed.

Valve K regulates the flow of $CO_2$ in the SCF effluent into a hydrocarbon knock out chamber 21 that is cooled to about 30° C. and is maintained at a pressure of about 30 to 70 atmospheres. The remaining portion of the SCF effluent which is comprised of $CO_2$ then passes through a chiller 22 which is maintained in a temperature range of 35° C. to 100° C. and at a pressure of from 30 to 70 atmospheres to control the flow of $CO_2$. Gaseous $CO_2$ flows into working tank 11 where it is mixed with fresh $CO_2$ from the make up tank 10 to complete the flow cycle.

Figure 2:
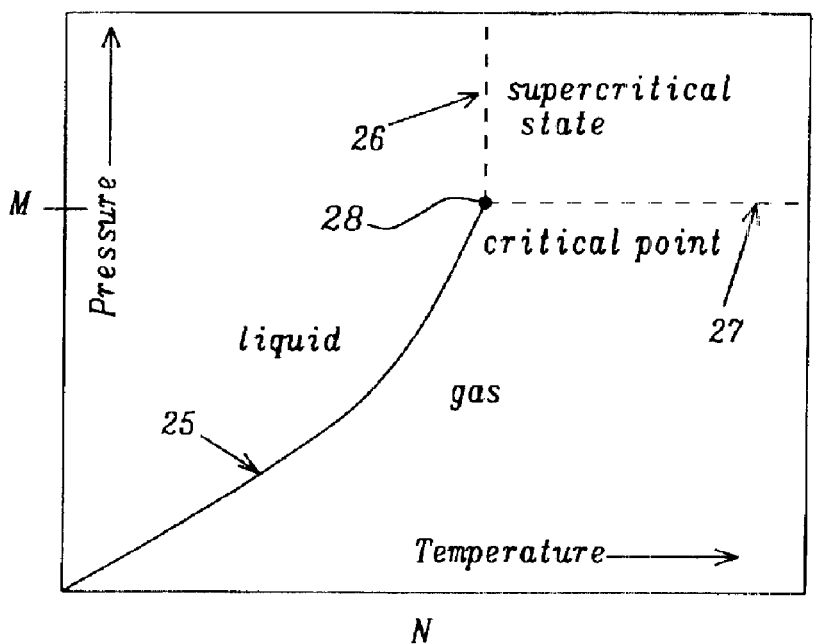
FIG. 2 is a phase diagram for $CO_2$ showing the relationship of various states to the pressure and temperature conditions.

Referring to FIG. 2, a phase diagram for $CO_2$ is shown in which temperature is represented on the x-axis and pressure is represented on the y-axis. To the left of the curve 25 which indicates the boundary between liquid and gas, $CO_2$ is in a liquid state. At conditions to the right of the curve 25, $CO_2$ is in a gaseous state. When temperature and pressure are at an (x,y) coordinate that is in the region bounded by dashed lines 26, 27 which intersect at critical point 28, then $CO_2$ is in a supercritical state. The conditions for critical point 28 are a pressure M of 72.9 atmospheres and a temperature N of 31.3° C. Supercritical $CO_2$ has a low viscosity, high diffusivity, and no surface tension and is therefore able to penetrate small pores quite easily. In the supercritical state, there is no boundary between liquid and gas.

In one embodiment depicted in FIGS. 3–6, a low k dielectric layer that is treated by a method of this invention is part of an interconnect structure that is to be fabricated with a damascene method. In another embodiment, the low k dielectric layer to be cured may be in an interconnect structure that is fabricated by a process involving the deposition of a low k dielectric layer on a patterned metal layer. Those skilled in the art will recognize that the patterned metal layer may be comprised of a composite. For example, an anti-reflective layer such as TiN may be on a metal layer such as aluminum. Furthermore, there may be a conformal oxide liner on the composite metal layer. In this case, a spin-on low k dielectric material such as hydrogen silsesquioxane (HSQ) or methyl silsesquioxane (MSQ) is preferred for its ability to fill small gaps between the metal lines in the patterned metal layer. The advantages realized for treating a low k dielectric layer in a damascene scheme in the first embodiment also apply to low k dielectric layers formed by a spin-on method in other interconnect fabrication schemes.

Figure 3:
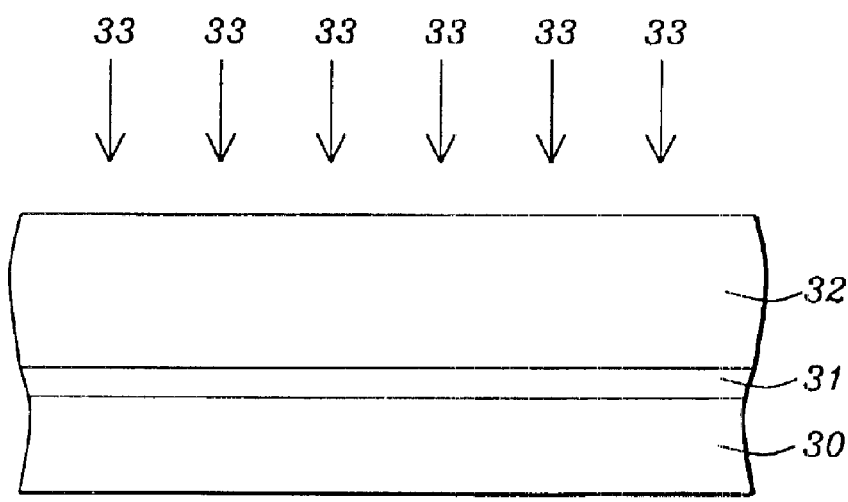
FIG. 3 is a cross-sectional view of a substrate with a dielectric layer that is being treated with a SCF containing a co-solvent according to one embodiment of the present invention.
Figure 4:
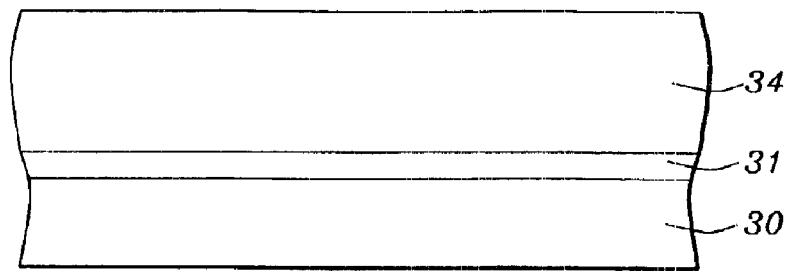
FIG. 4 is a cross-sectional view of the substrate in FIG. 3 where the cured dielectric layer has altered properties and a different composition.

Referring to FIG. 3, a cross-sectional view of a coated substrate 30 is shown. In one embodiment, substrate 30 is a 300 mm diameter wafer that is preferably processed in a single wafer mode. Substrate 30 can be doped or undoped and may be based on silicon, silicon-germanium, or gallium-arsenide technology. Substrate 30 may be further comprised of a substructure (not shown) that contains active and passive devices and various levels of metal interconnects and dielectric layers. An etch stop layer 31 such as silicon carbide, silicon nitride, or silicon oxynitride is typically deposited on substrate 30 by a chemical vapor deposition (CVD) or plasma enhanced CVD technique.

A low k dielectric layer 32 with a thickness in the range of about 1000 Angstroms to 9000 Angstroms is formed by spin coating a commercially available solution on etch stop layer 31. Those skilled in the art are familiar with the various coating tools and processes that can be employed to form a uniform low k dielectric layer 32 and the details will not be provided here. Spin-on compositions include inorganic silsesquioxanes (HSQ, Dow FOx), organic silsesquioxanes (MSSQ, Accuspin-R7, HSG-R7), polyarylethers (PAE2.3, FLARE 2.0), bisbenzocyclobutenes, and SiLK from Dow Corning. Most of these materials have a k value for cured layers in the range of about 2.6 to 2.9. Furthermore, the pore volume of low k dielectric layer 32 is from 20% to approximately 40% of the total volume of solid. The pore size may be as small as 1 nm. The coated dielectric layer 32 may be heated to a temperature in a range of about 100° C. to 200° C. to remove most of the residual solvent in the film before the curing process of the present invention.

In one embodiment, low k dielectric layer 32 in FIG. 3 is treated with a supercritical fluid (SCF) 33 that includes $CO_2$ and a co-solvent. The SCF 33 treatment is preferably carried out in a continuous loop system as depicted in FIG. 1. Depending on the composition of low k dielectric layer 32 and the desired properties of the cured low k dielectric layer 34 in FIG. 4, different co-solvents may be used. For example, when layer 32 contains C—$CH_3$ groups, a co-solvent with the formula $CF_3$—X where X=$NR_1R_2$, —$OR_3$, —$O_2CR_3$, —(C=O)$R_3$, or $R_3$ and $R_1$, $R_2$, $R_3$=H or an alkyl group can be employed as co-solvent to replace $CH_3$ with a $CF_3$ group and form a C—$CF_3$ bond, thereby lowering the dielectric constant of the cured low k dielectric layer 34 relative to coated low k dielectric layer 32. Similarly, a co-solvent with the formula Y—F where Y=H or an alkyl group may be employed to replace a methyl group in a C—$CH_3$ bond with F to form a C—F bond and lower the dielectric constant. Yet another example is the use of $H_2O_2$ as co-solvent to replace a halogen (Z) where Z=Cl, Br, F in a C—Z bond in low k dielectric layer 32 with an hydroxyl group to form a C—OH bond that improves adhesion of cured low k dielectric layer 34 to etch stop 31 and to layers that are subsequently deposited on cured low k dielectric layer 34. For all spin-on low k dielectric layers including those without C—$CH_3$ bonds or halogen groups, the SCF 33 diffuses through the pores of low k dielectric layer 32 to extract residual solvent and low molecular weight compounds from the polymer matrix which is the major component of low k dielectric layer 32 and thereby cures layer 32.

Treatment of low k dielectric layer 32 with a SCF 33 that includes $CO_2$ and co-solvent also increases the hardness of cured low k dielectric layer 34 by about 1% to 5% to improve resistance to subsequent polishing steps such as a chemical mechanical polish (CMP) process. Likewise, the elastic modulus is strengthened to prevent the cured low k dielectric layer 34 from becoming brittle and cracking in later process steps. In prior art, dielectric layers have been densified by a plasma treatment which is not selective in the removal of certain groups and typically breaks bonds between any two atoms including those in a polymer chain that reduces the molecular weight of the polymer and is detrimental to the performance of the dielectric material. In cases where a Si—C bond is broken by a plasma treatment that involves $N_2$, $NH_3$, or He, a dangling bond is formed that is likely to cause water absorption and an increase in dielectric constant. The SCF treatment of the present invention is an improvement in that it cures a spin-on low k dielectric layer without a high temperature bake or a high energy plasma treatment. The SCF process of this invention selectively replaces certain groups such as methyl groups when they are present in the polymer matrix with other groups including trifluoromethyl, fluoro, or hydroxyl groups.

A typical SCF 33 composition when $CF_3$—X is employed as co-solvent is generated by a $CO_2$ flow rate of about 1000 to 15000 sccm and a $CF_3$—X flow rate of about 50 to 100 sccm. Similarly, with a mixture including $CO_2$ and a Y—F co-solvent, the preferred SCF 33 composition is produced by a $CO_2$ flow rate of about 1000 to 15000 sccm and a Y—F flow rate between about 50 and 100 sccm. In a SCF 33 composition comprising $CO_2$ and $H_2O_2$, the $CO_2$ flow rate is from about 1000 to 15000 sccm and the $H_2O_2$ flow rate is from 0 to about 1000 sccm. Low k dielectric layer 32 on substrate 30 is treated by SCF 33 for a period of about 60 to 360 seconds in order to complete the curing process.

Several benefits are realized by curing low k dielectric layer 32 with the method of the present invention. Conventionally, coated substrates are baked in a batch operation to drive off solvent and cure a dielectric layer. However, baking substrates such as wafers in this manner requires a large furnace that takes up valuable floor space and is slow to ramp up to elevated temperatures of 350° C. to 450° C. needed for curing the material. The SCF method of this invention is a more efficient use of energy Components in a dielectric film can also sublime or collect on the inner surface of the furnace in a conventional cure process and later become detached and fall as contaminants on another wafer to form defects. The SCF method of this invention avoids cross contamination from one substrate to another. The conventional batch mode process used for 200 mm substrates is not compatible with a single wafer mode that is required for processing 300 mm substrates in new technologies. In contrast, the method described in the first embodiment is optimized for a single wafer mode and accommodates large substrates. In summary, the SCF method of this invention is desirable because it is more cost effective in terms of higher throughput, lower energy consumption, fewer defects, and requiring less floor space than prior art methods.

Figure 5:
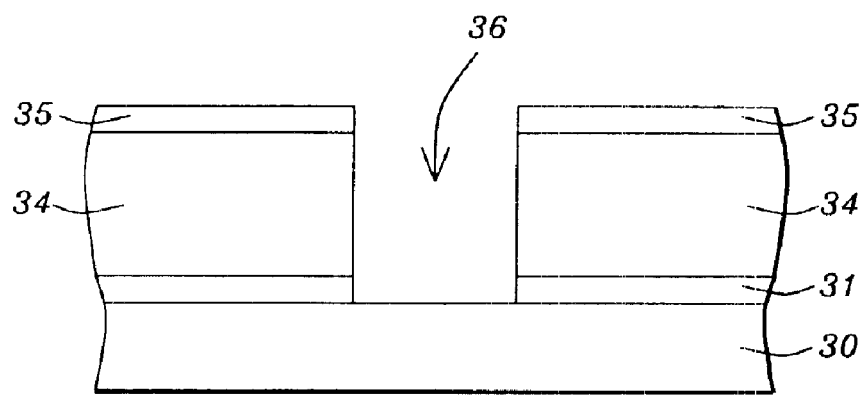
FIG. 5 is a cross-sectional view of the substrate in FIG. 4 in which an opening has been formed in the cured dielectric layer by a damascene process.
Figure 6:
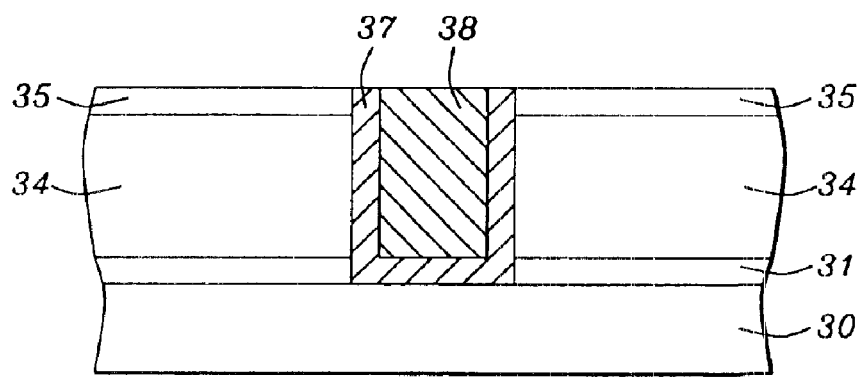
FIG. 6 is a cross-sectional view of the substrate in FIG. 5 where the opening has been filled with a barrier metal liner and a metal to form an interconnect structure.

Referring to FIGS. 5–6, the damascene structure formed by employing a cured low k dielectric layer 34 of this invention is illustrated. The drawings are intended to serve as an example and are not meant to limit the scope of the invention. In FIG. 5, an optional cap layer 35 such as silicon nitride or silicon oxynitride is deposited on cured low k dielectric layer 34. An opening 36 is then formed in the stack comprised of etch stop layer 31, cured low k dielectric layer 34, and cap layer 35 by conventional means that usually involves patterning a photoresist (not shown) on cap layer 35 and transferring the opening in the photoresist layer through underlying layers with one or more plasma etch steps. The opening 36 can be a via hole or trench in a single damascene process or the opening can represent a trench formed above a via hole in a dual damascene method.

FIG. 6 shows the result of a damascene process in which a barrier metal liner 37 such as Ta, W, TaN, WN, TaSiN, Ti, or TiN is deposited in opening 36 and a metal such as copper, tungsten, aluminum or an Al/Cu alloy is deposited on barrier metal liner 37. A planarizing step such as a CMP process can be employed to lower the level of metal 37 so that it is coplanar with cap layer 35. In another embodiment, the cap layer 35 is removed during the CMP process and metal layer 37 becomes coplanar with cured low k dielectric layer 34.

In a second embodiment, low k dielectric layer 32 in FIG. 3 is treated with a supercritical fluid (SCF) 33 that includes $CO_2$ and two co-solvents. Low k dielectric layer 32 preferably has a pore volume of between 20% and 40% of the total volume of the porous solid. The pore size may be as small as 1 nm. Depending on the composition of low k dielectric layer 32 and the desired properties of the cured low k dielectric layer 34 in FIG. 4, different combinations of co-solvents may be used. For example, when layer 32 contains C—$CH_3$ bonds, a co-solvent having the formula $CF_3$—X where X=$NR_1R_2$, —$OR_3$, —$O_2CR_3$, —(C=O)$R_3$, or $R_3$ and $R_1$, $R_2$, $R_3$=H or an alkyl group may be used in combination with a co-solvent with the formula Y—F where Y=H or an alkyl group. $CF_3$—X is used to replace some of the $CH_3$ groups with $CF_3$ groups and form C—$CF_3$ bonds while Y—F is used to replace some of the methyl groups with F to form C—F bonds. The dielectric constant of the cured low k dielectric layer 34 is thereby reduced relative to low k dielectric layer 32.

Alternatively, Y—F and $H_2O_2$ are employed as co-solvents with $CO_2$ in an SCF 33 treatment to cure the low k dielectric layer 32. When low k dielectric layer 32 contains C—$CH_3$ bonds, some of the methyl groups are replaced with F from the Y—F co-solvent to form C—F bonds and some of the methyl groups are replaced by hydroxyl groups from $H_2O_2$ to form C—OH bonds which improve adhesion of cured low k dielectric layer 34 to cap layer 35 that is subsequently deposited on the cured low k dielectric layer 34. For all spin-on low k dielectric layers including those without C—$CH_3$ bonds or halogen groups, the SCF 33 diffuses through the pores of low k dielectric layer 32 to extract residual solvent and low molecular weight compounds from the polymer matrix which is the major component of low k dielectric layer 32 and thereby cures layer 32.

Treatment of low k dielectric layer 32 with a SCF 33 that includes $CO_2$ and two co-solvents also increases the hardness of cured low k dielectric layer 34 by about 1% to 5% to improve resistance to a subsequent planarizing step. Likewise, the elastic modulus is strengthened to prevent the cured low k dielectric layer 34 from becoming brittle and cracking in later process steps. In prior art, dielectric layers have been densified by a plasma treatment which is not selective in the removal of certain groups and is likely to break bonds and degrade the polymer matrix which is detrimental to the performance of the dielectric material. The SCF 33 treatment of the present invention is an improvement in that it selectively replaces certain groups such as methyl groups with trifluoromethyl, fluoro, or hydroxyl groups and cures a spin-on low k dielectric layer without a high temperature bake or a high energy plasma treatment.

A typical SCF 33 composition when $CF_3$—X and Y—F are employed as co-solvents with $CO_2$ is generated by a $CO_2$ flow rate from about 1000 to 15000 sccm, a $CF_3$—X flow rate of about 50 to 1000 sccm, and a Y—F flow rate of about 50 to 100 sccm. In the example where Y—F and $H_2O_2$ are used in combination with $CO_2$, the preferred SCF 33 composition is produced by a $CO_2$ flow rate from about 1000 to 15000 sccm, a Y—F flow rate of about 50 to 100 sccm and a $H_2O_2$ flow rate of about 50 to 1000 sccm.

The benefits realized by curing a low k dielectric layer 32 with an SCF comprised of $CO_2$ and two co-solvents are the same as described in a previous embodiment for an SCF 33 comprised of $CO_2$ and one co-solvent. However, in some cases an additional advantage is gained with two co-solvents since extra flexibility is provided for modifying the structure of the low k dielectric layer 32 since the ratio of C—$CF_3$ groups to C—F groups or the ratio of C—F groups to C—OH groups may be adjusted depending on the desired properties of cured low k dielectric layer 34. The cured low k dielectric layer 34 of the second embodiment may be implemented in an interconnect fabrication scheme as illustrated in FIGS. 5–6 and described previously in the first embodiment.

The present invention is also an apparatus that is used for curing and modifying a low k dielectric layer on a substrate by employing a method described in the previous embodiments. The apparatus is comprised of a continuous loop system that can withstand pressures from about 70 to 700 atmospheres and temperatures of about 30° C. to 150° C. and includes a process chamber that is capable of holding a 300 mm wafer in place during a supercritical fluid (SCF) treatment, a port for an end point detection system, a separator for removing co-solvents, solids, monomers, $O_2$, and $N_2$ from the SCF, a hydrocarbon knock out chamber, a chiller, a working $CO_2$ tank, a preheater, and a $CO_2$ pump. The apparatus is further comprised of a make up tank for $CO_2$, a source tank for a first co-solvent and a second source tank for a second co-solvent, pumps for introducing co-solvents into the continuous loop system and tubing and valves for directing, regulating, and containing the SCF flow within the continuous loop. The supercritical fluid employed in the apparatus is comprised of $CO_2$ and one or more co-solvents that were described in the first two embodiments.

The arrangement of components within the continuous loop SCF system enables an efficient process for curing and modifying a low k dielectric layer on a single substrate in the process chamber. A description of the components within the apparatus was previously mentioned during an explanation of FIG. 1.

While this invention has been particularly shown and described with reference to, the preferred embodiments thereof, it will be understood by those skilled in the art that various changes in form and details may be made without departing from the spirit and scope of this invention.

We claim:

1. A method of curing and modifying a low k dielectric layer on a substrate, comprising:

providing a substrate;

coating a spin-on low k dielectric layer on said substrate;

positioning said substrate in a process chamber; and treating said substrate with a supercritical fluid (SCF) comprised of $CO_2$ and a co-solvent which is $H_2O_2$, $CF_3$—X, or Y—F wherein X=$NR_1R_2$, —$OR_3$, —$O_2CR_3$, —(C=O)$R_3$, or $R_3$ and wherein Y=H or an alkyl group and $R_1$, $R_2$, $R_3$=H or an alkyl group, at least until an endpoint is reached.

2. The method of claim 1 wherein said dielectric layer is a low k material selected from a including inorganic silsesquioxanes, organic silsesquioxanes, polyarylethers, and bisbenzocyclobutenes.

3. The method of claim 1 wherein the process chamber is part of a supercritical $CO_2$ system that is capable of a continuous flow.

4. The method of claim 1 wherein the process chamber is designed for a single wafer mode.

5. The method of claim 1 wherein the low k dielectric layer has a pore volume between about 20% and 40% of the total solid volume of said layer.

6. The method of claim 1 wherein said low k dielectric layer has a thickness in a range of about 1000 to 9000 Angstroms.

7. The method of claim 1 wherein said substrate is treated with a supercritical fluid at a temperature of about 30° C. to 150° C.

8. The method of claim 1 wherein said substrate is treated with a supercritical fluid at a pressure between 70 atmospheres and 700 atmospheres.

9. The method of claim 1 wherein said substrate is treated with a SCF comprised of $CO_2$ and $CF_3$—X wherein the $CO_2$ flow rate is from about 1000 to 15000 standard cubic centimeters per minute (sccm) and the $CF_3$—X flow rate is from about 50 to 100 sccm.

10. The method of claim 1 wherein said substrate is treated with a SCF comprised of $CO_2$ and Y—F wherein the $CO_2$ flow rate is from about 1000 to 15000 sccm and the Y—F flow rate is from about 50 to 100 sccm.

11. A method of curing and modifying a low k dielectric layer on a substrate, comprising:

providing a substrate;

coating a spin-on low k dielectric layer on said substrate;

positioning said substrate in a process chamber; and treating said substrate with a SCF comprised of $CO_2$ and $H_2O_2$ wherein the $CO_2$ flow rate is from about 1000 to 15000 standard cubic centimeters per minute (sccm) and the $H_2O_2$ flow rate is between 0 and about 1000 sccm.

12. A method of curing and modifying a low k dielectric layer on a substrate, comprising:
   providing a substrate;
   coating a spin-on low k dielectric layer on said substrate;
   positioning said substrate in a process chamber; and
   treating said substrate with a supercritical fluid (SCF) comprised of $CO_2$ and a co-solvent which is $H_2O_2$, $CF_3$—X, or Y—F wherein X=$NR_1R_2$, —$OR_3$, —$O_2CR_3$, —(C=O)$R_3$, or $R_3$ and wherein Y=H or an alkyl group and $R_1$, $R_2$, $R_3$=H or an alkyl group wherein said SCF is further comprised of a second co-solvent that is selected from the aforementioned co-solvents $CF_3$—X, Y—F, and $H_2O_2$ and wherein the second co-solvent is different than the first co-solvent.

13. The method of claim 12 wherein the SCF is comprised of $CO_2$, $CF_3$—X and Y—F wherein the $CO_2$ flow rate is from about 1000 to 15000 sccm, the $CF_3$—X flow rate is between about 50 and 1000 sccm and the Y—F flow rate is from about 50 to 100 sccm.

14. The method of claim 12 wherein the SCF is comprised of $CO_2$, $H_2O_2$, and Y—F wherein the $CO_2$ flow rate is from about 1000 to 15000 sccm, the $H_2O_2$ flow rate is between about 50 and 1000 sccm and the Y—F flow rate is from about 50 to 100 sccm.

15. The method of claim 12 wherein the SCE is comprised of $CO_2$, $H_2O_2$, and $CF_3$—X wherein the $CO_2$ flow rate is about 1000 to 15000 sccm, the $H_2O_2$ flow rate is about 50 to 1000 sccm, and the $CF_3$—X flow rate is about 50 to 100 sccm.

16. A damascene process comprising the steps of:
   (a) providing a substrate upon with an etch stop layer formed thereon;
   (b) coating a spin-on low k dielectric layer on said etch stop layer;
   (c) curing and modifying said low k dielectric layer by treating with a supercritical fluid comprised of $CO_2$ an a co-solvent which is $H_2O_2$, $CF_3$—X, or Y—F wherein X=$NR_1R_2$, —$OR_3$, —$O_2CR_3$, —(C=O)$R_3$, or $R_3$ and wherein Y=H or an alkyl group and $R_1$, $R_2$, $R_3$=H or an alkyl group;
   (d) forming an opening in the stack comprised of said low k dielectric layer and said etch stop layer;
   (e) depositing a barrier metal liner in said opening;
   (f) depositing a metal on said barrier metal liner to fill said opening; and
   (g) planarizing said metal so that it is coplanar with said low k dielectric layer.

17. The method of claim 16 further comprised of forming a cap layer which is silicon nitride or silicon oxynitride on said cured low k dielectric layer prior to forming said opening.

18. The method of claim 17 wherein said etch stop layer is comprised of silicon nitride, silicon oxynitride or silicon carbide.

19. The method of claim 16 wherein said low k dielectric layer is comprised of a material selected from a group including inorganic silsesquioxanes, organic silsesquioxanes, polyarylethers, and bisbenzocylobutene.

20. The method of claim 16 wherein said low k dielectric layer is cured in a process chamber in a single wafer mode.

21. The method of claim 16 wherein said low k dielectric layer is cured in a supercritical $CO_2$ system in a continuous flow process.

22. The method of claim 16 wherein said low k dielectric layer has a pore volume between about 20% and 40% of the total said volume of said layer.

23. The method of claim 16 wherein said low k dielectric layer has a thickness in a range of about 1000 to 9000 Angstroms.

24. The method of claim 16 wherein said substrate is treated with a supercritical fluid at a temperature between about 30° C. and 150° C.

25. The method of claim 16 wherein said substrate is treated with a supercritical fluid at a pressure between about 70 atmospheres and 700 atmospheres.

26. The method of claim 16 wherein said substrate is treated with a SCF comprised of $CO_2$ and $CF_3$—X wherein the $CO_2$ flow rate is from about 1000 to 15000 sccm and the $CF_3$—X flow rate is from about 50 to 100 sccm.

27. The method of claim 16 wherein said substrate is treated with a SCF comprised of $CO_2$ and Y—F wherein the $CO_2$ flow rate is from about 1000 to 15000 sccm and the Y—F flow rate is from about 50 to 100 sccm.

28. The method of claim 16 wherein said substrate is treated with a SCF comprised of $CO_2$ and $H_2O_2$ wherein the $CO_2$ flow rate is from about 1000 to 15000 standard cubic centimeters per minute (sccm) and the $H_2O_2$ flow rate is between 0 and about 1000 sccm.

29. The method of claim 16 wherein said SCF is further comprised of a second co-solvent that is selected from the aforementioned co-solvents $CF_3$—X, Y—F, and $H_2O_2$ and wherein the second co-solvent is different than the first co-solvent.

30. The method of claim 29 wherein the SCF is comprised of $CO_2$, $CF_3$—X and Y—F wherein the $CO_2$ flow rate is from about 1000 to 15000 sccm, the $CF_3$—X flow rate is between about 50 and 1000 sccm and the Y—F flow rate is from about 50 to 100 sccm.

31. The method of claim 29 wherein the SCF is comprised of $CO_2$, $H_2O_2$, and Y—F wherein the $CO_2$ flow rate is from about 1000 to 15000 sccm, the $H_2O_2$ flow rate is between about 50 and 1000 sccm and the Y—F flow rate is from about 50 to 100 sccm.

32. The method of claim 16 wherein said opening is a via hole or a trench or a trench formed above a via hole.

33. The method of claim 16 wherein said barrier metal is comprised of Ta, TaN, W, WN, Ti, TIN, or TaSiN.

34. The method of claim, 16 wherein said metal layer is comprised of copper, aluminum, or a Cu/Al alloy.

35. The method of claim 29 wherein the SCF is comprised of $CO_2$, $H_2O_2$, and $CF_3$—X wherein the $CO_2$ flow rate is about 1000 to 15000 sccm, the $H_2O_2$ flow rate is about 50 to 1000 sccm, and the $CF_3$—X flow rate is about 50 to 100 sccm.

36. An apparatus for curing and modifying a low k dielectric material on a substrate, comprising a continuous loop SCF system that can withstand pressures from about 70 to 700 atmospheres and temperatures of about 30° C. to 150° C., comprising:
   (a) a process chamber capable of holding a 300 mm wafer in place during a supercritical fluid (SCF) treatment;
   (b) a port with a connection to an end point detection system;
   (c) a separator for removing co-solvents, solids, monomers, $O_2$, and $N_2$ from the SCF;
   (d) a hydrocarbon knock out chamber;
   (e) a chiller;
   (f) a working $CO_2$ tank;
   (g) a make up tank for $CO_2$ and a source tank for a first co-solvent and a second source tank for a second co-solvent;
   (h) a preheater for heating the SCF in the loop before entering the process chamber;

(i) a $CO_2$ pump and pumps for introducing co-solvents into the continuous loop system;

(j) tubing and valves for directing, regulating, and containing the SCF flow within the continuous loop;

(k) a supercritical fluid comprised of $CO_2$ and one or more co-solvents selected from a group including $H_2O_2$, $CF_3$—X, or Y—F wherein $X=NR_1R_2$, —$OR_3$, —$O_2CR_3$, —(C=O)$R_3$, or $R_3$ and wherein Y=H or an alkyl group and $R_1$, $R_2$, $R_3$=H or an alkyl group.

37. The apparatus of claim 36 wherein the $CO_2$ make-up tank is connected to the continuous loop system between the chiller and the $CO_2$ working tank.

38. The apparatus of claim 36 wherein the inlet valves for the co-solvents are connected to a point on the continuous loop system between the $CO_2$ pump and the preheater.

39. The apparatus of claim 36 wherein the port for the end point detect measurement device is located in the continuous loop immediately downstream from the process chamber.

40. The apparatus of claim 36 wherein the continuous loop between the process chamber and the $CO_2$ pump successively passes through a separator, a hydrocarbon knock out chamber, a chiller, and a working $CO_2$ tank.

41. The apparatus of claim 36 wherein the process chamber may be isolated and the continuous flow stopped to allow pressure to be reduced to 1 atmosphere and to allow temperature to be lowered to room temperature within said chamber so that a finished substrate may be removed and replaced with an untreated substrate.

42. The apparatus of claim 36 which is capable of maintaining a SCF flow rate of 1 to 15 liters per minute.

43. An apparatus for curing and modifying a low k dielectric material on a substrate, comprising a continuous loop SCF system that can withstand pressures from about 70 to 700 atmospheres and temperatures of about 30° C. to 150° C., comprising:

a process chamber capable of holding a 300 mm wafer in place during a supercritical fluid (SCF) treatment;

a port with a connection to an end point detection system;

a separator for removing co-solvents, solids, monomers, $O_2$, and $N_2$ from the SCF;

a hydrocarbon knock out chamber;

a chiller;

a working $CO_2$ tank;

a make up tank for $CO_2$ and a source tank for a first co-solvent and a second source tank for a second co-solvent;

a preheater for heating the SCF in the loop before entering the process chamber wherein the continuous loop from the $CO_2$ pump passes through a preheater or a by-pass loop around said preheater just prior to entering the process chamber;

a $CO_2$ pump and pumps for introducing co-solvents into the continuous loop system;

tubing and valves for directing, regulating, and containing the SCE flow within the continuous loop; and a supercritical fluid comprised of $CO_2$ and one or more co-solvents selected from a group including $H_2O_2$, $CF_3$—X, or Y—F wherein $X=NR_1R_2$, —$OR_3$, —$O_2CR_3$, —(C=O)$R_3$, or $R_3$ and wherein Y=H or an alkyl group and $R_1$, $R_2$, $R_3$=H or an alkyl group.

44. An apparatus for treating a low k dielectric material on a substrate comprising:

a process chamber;

an end point detection system in fluid communication with the process chamber;

a separator in fluid communication with the process chamber;

a hydrocarbon knock out chamber in fluid communication with the separator;

a chiller in fluid communication with the hydrocarbon knock out chamber;

a $CO_2$ working tank in fluid communication with the chiller;

a $CO_2$ make up tank in fluid communication with the $CO_2$ working tank;

a $CO_2$ pump in fluid communication with the $CO_2$ working tank;

a source tank for a first co-solvent;

a first co-solvent pump in fluid communication with the first co-solvent source tank and in fluid communication with the $CO_2$ pump;

a preheater in fluid communication with the $CO_2$ pump;

a supercritical fluid (SCF) comprised of $CO_2$ and at least one co-solvent; and tubing and valves for directing, regulating, and containing the SCF flow within a continuous loop.

45. The apparatus of claim 44 wherein the process chamber may be isolated and the continuous flow stopped.

46. The apparatus of claim 45 wherein the isolated process chamber may reach ambient pressure and temperature such that a substrate may be removed.

47. The apparatus of claim 44 wherein SCF flow rate is about 1000 to 17000 sccm.

48. The apparatus of claim 44 wherein the system is adapted to operate at a pressure of about 70 to 700 atmospheres.

49. The apparatus of claim 44 wherein the system is adapted to operate at a temperature of about 30° C. to 150° C.

50. The apparatus of claim 44 wherein the process chamber is capable of holding a 300 mm wafer.

51. The apparatus of claim 44 wherein the separator is capable of removing at least one of co-solvents, solids, monomers, $O_2$, and $N_2$ from the SCF.

52. The apparatus of claim 44 wherein the SCF is comprised of $CO_2$ and $CF_3$—X where $X=NR_1R_2$, —$OR_3$, —$O_2CR_3$, —(C=O)$R_3$, or $R_3$ and where $R_1$, $R_2$, $R_3$=H or an alkyl group.

53. The apparatus of claim 52 wherein the $CO_2$ flow rate is about 1000 to 15000 sccm and the $CF_3$—X flow rate is about 50 to 100 sccm.

54. The apparatus of claim 44 wherein the SCF is comprised of $CO_2$ and Y—F where Y=H or an alkyl group.

55. The apparatus of claim 54 wherein the $CO_2$ flow rate is about 1000 to 15000 sccm and the Y—F flow rate is about 50 to 100 sccm.

56. The apparatus of claim 44 wherein the SCF is comprised of $CO_2$ and $H_2O_2$.

57. The apparatus of claim 56 wherein the $CO_2$ flow rate is about 1000 to 15000 sccm and the $H_2O_2$ flow rate is about 50 to 1000 sccm.

58. The apparatus of claim 44 further comprising:

a source tank for a second co-solvent; and a second co-solvent pump in fluid communication with the second co-solvent source tank and in fluid communication with the $CO_2$ pump.

59. The apparatus of claim 44 wherein the SCF is further comprised of a second co-solvent different than the first co-solvent.

60. The apparatus of claim 59 wherein the SCF is comprised of $CO_2$, $CF_3$—X where $X=NR_1R_2$, —$OR_3$, —$O_2CR_3$, —(C=O)R$_3$, or R$_3$ and where R$_1$, R$_2$, R$_3$=H or an alkyl group, and Y—F where Y=H or an alkyl group.

61. The apparatus of claim 60 wherein the CO$_2$ flow rate is about 1000 to 15000 sccm, the CF$_3$—X flow rate is about 50 and 100 sccm, and the Y—F flow rate is about 50 to 100 sccm.

62. The apparatus of claim 59 wherein the SCF is comprised of CO$_2$, H$_2$O$_2$, and Y—F where Y=H or an alkyl group.

63. The apparatus of claim 62 wherein the CO$_2$ flow rate is about 1000 to 15000 sccm, the H$_2$O$_2$ flow rate is about 50 and 1000 sccm, and the Y—F flow rate is about 50 to 100 sccm.

64. The apparatus of claim 59 wherein the SCF is comprised of CO$_2$, H$_2$O$_2$, and CF$_3$—X where X=NR$_1$R$_2$, —OR$_3$, —O$_2$CR$_3$, —(C=O)R$_3$, or R$_3$ and where R$_1$, R$_2$, R$_3$=H or an alkyl group.

65. The apparatus of claim 64 wherein the CO$_2$ flow rate is about 1000 to 15000 sccm, the H$_2$O$_2$ flow rate is about 50 and 1000 sccm, and the CF$_3$—X flow rate is about 50 to 100 sccm.

66. The apparatus of claim 44 wherein the SCF is configured to bypass the preheater.

67. The apparatus of claim 66 wherein the SCF is configured to physically bypass the preheater.

68. A method of treating a low k dielectric layer on a substrate comprising:
  spinning a low k dielectric layer onto a substrate; and
  treating the layer with a supercritical fluid (SCF) comprised of CO$_2$ and first co-solvent H$_2$O$_2$, wherein the layer is treated at least until an endpoint is reached.

69. The method of claim 68 wherein the dielectric layer is a low k material selected from a group including inorganic silsesquioxanes, organic silsesquioxanes, polyarylethers and bisbenzocyclobutenes.

70. The method of claim 68 wherein one substrate is treated at a time.

71. The method of claim 68 wherein the low k dielectric layer has a pore volume of about 20% to 40% of the total solid volume of the layer.

72. The method of claim 68 wherein the low k dielectric layer has a thickness of about 1000 to 9000 Angstroms.

73. The method of claim 68 wherein the substrate is treated with a SCF at a temperature of about 30° C. to 150° C.

74. The method of claim 68 wherein the substrate is treated with a SCF at a pressure of about 70 to 700 atmospheres.

75. A method of treating a low k dielectric layer on a substrate comprising:
  spinning a low k dielectric layer onto a substrate; and
  treating the layer with a supercritical fluid (SCF) comprised of CO$_2$ and first co-solvent H$_2$O$_2$, wherein the CO$_2$ flow rate is about 1000 to 15000 sccm and the H$_2$O$_2$ flow rate is about 50 to 1000 sccm.

76. A method of treating a low k dielectric layer on a substrate comprising:
  spinning a low k dielectric layer onto a substrate; and
  treating the layer with a supercritical fluid (SCF) comprised of CO$_2$ and first co-solvent H$_2$O$_2$, wherein the SCF further comprises a second co-solvent, and wherein the second co-solvent is CF$_3$—X where X=NR$_1$R$_2$, —OR$_3$, —O$_2$CR$_3$, —(C=O)R$_3$, or R$_3$ and where R$_1$, R$_2$, R$_3$=H or an alkyl group.

77. The method of claim 76 wherein the CO$_2$ flow rate is about 1000 to 15000 sccm, the H$_2$O$_2$ flow rate is about 50 to 1000 sccm, and the CF$_3$—X flow rate is about 50 to 100 sccm.

78. A method of treating a low k dielectric layer on a substrate comprising:
  spinning a low k dielectric layer onto a substrate; and
  treating the layer with a supercritical fluid (SCF) comprised of CO$_2$ and first co-solvent H$_2$O$_2$, wherein the SCF further comprises a second co-solvent, and wherein the second co-solvent is Y—F where Y=H or an alkyl group, and wherein the CO$_2$ flow rate is about 1000 to 15000 sccm, the H$_2$O$_2$ flow rate is about 50 to 1000 sccm, and the Y—F flow rate is about 50 to 100 sccm.

* * * * *